United States Patent [19]

Sutherland et al.

[11] 4,374,362
[45] Feb. 15, 1983

[54] INSTRUMENT ZEROING CIRCUIT

[75] Inventors: George K. Sutherland, White Bear Lake; Thomas J. Thielen, Minneapolis, both of Minn.

[73] Assignee: Sys-Tec, Inc., New Brighton, Minn.

[21] Appl. No.: 235,151

[22] Filed: Feb. 17, 1981

[51] Int. Cl.$^3$ ............................................. H03L 1/00
[52] U.S. Cl. ................................. 328/162; 307/264; 307/359; 328/175; 330/11
[58] Field of Search ....................... 307/264, 359, 475; 328/163, 165, 175, 162; 330/11, 149

[56] References Cited

U.S. PATENT DOCUMENTS

| | | | |
|---|---|---|---|
| 3,824,481 | 7/1974 | Sponholz et al. | 330/11 |
| 4,193,039 | 3/1980 | Massa et al. | 328/162 |
| 4,229,703 | 10/1980 | Bustin | 328/162 |

*Primary Examiner*—John Zazworsky
*Attorney, Agent, or Firm*—Orrin M. Haugen; Thomas J. Nikolai; Douglas L. Tschida

[57] ABSTRACT

An electronic interface circuit for coupling a source of analog signals to a measuring and/or recording device whereby the time varying component of the analog signal can be separated from any steady-state component, such as a DC bias, which may be present, allowing further signal processing on the time varying component only. The interface circuit comprises a servo control device having both a digital feedback loop and an analog feedback loop. Upon closure of a manually operable switch, a timer is initiated which first actuates the digital feedback loop wherein a digital number is generated which is proportional to the deviation of the signal output from a summing amplifier from a zero volt level. This digital number is applied through a digital-to-analog converter to the summing amplifier along with a second feedback signal obtained by sampling the output from the summing amplifier at a time subsequent to the digital correction operation. As a result, the deviation of the steady-state signal from zero occasioned by the inherent granularity in the analog-to-digital conversion process is eliminated.

4 Claims, 4 Drawing Figures

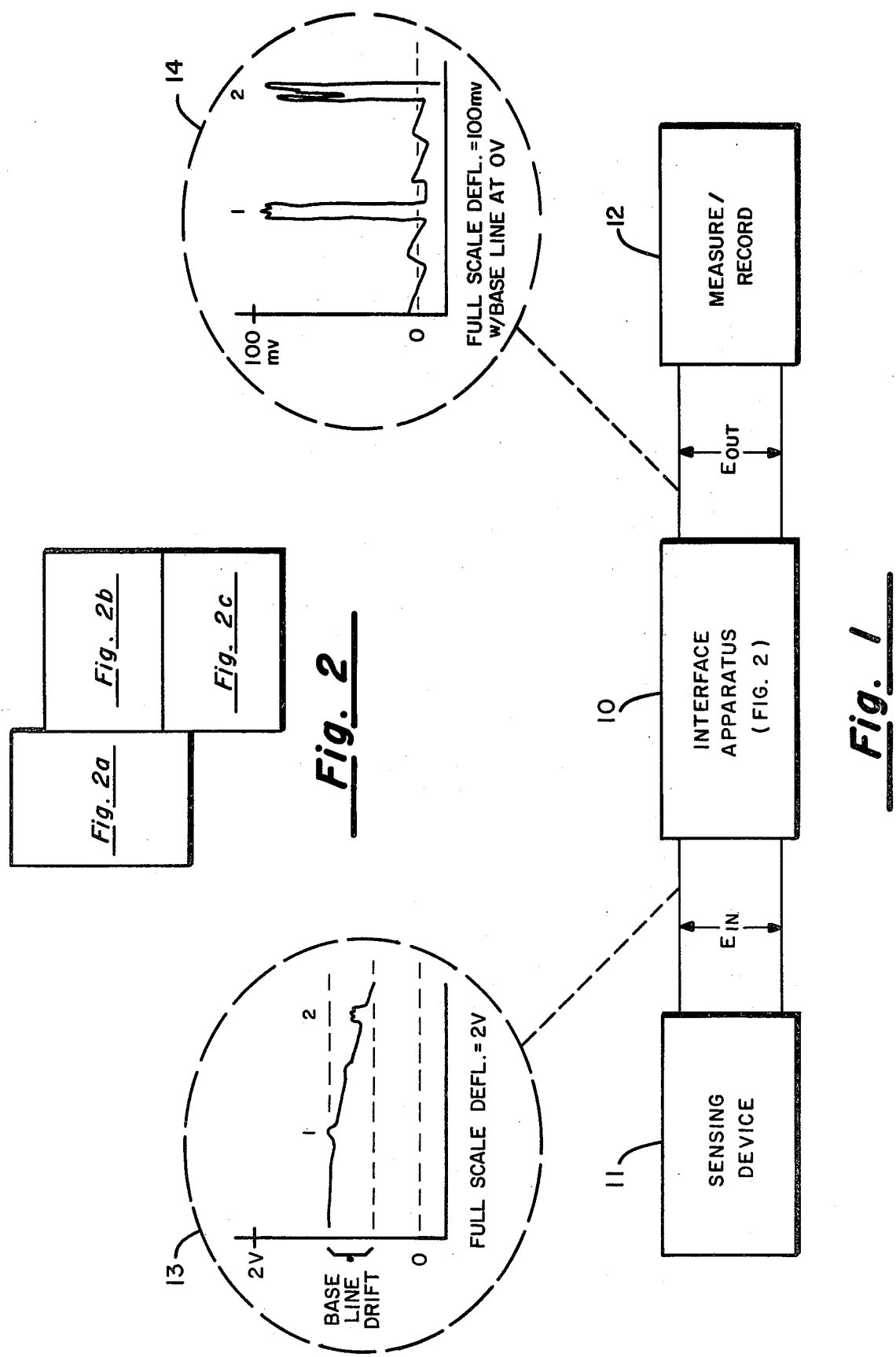

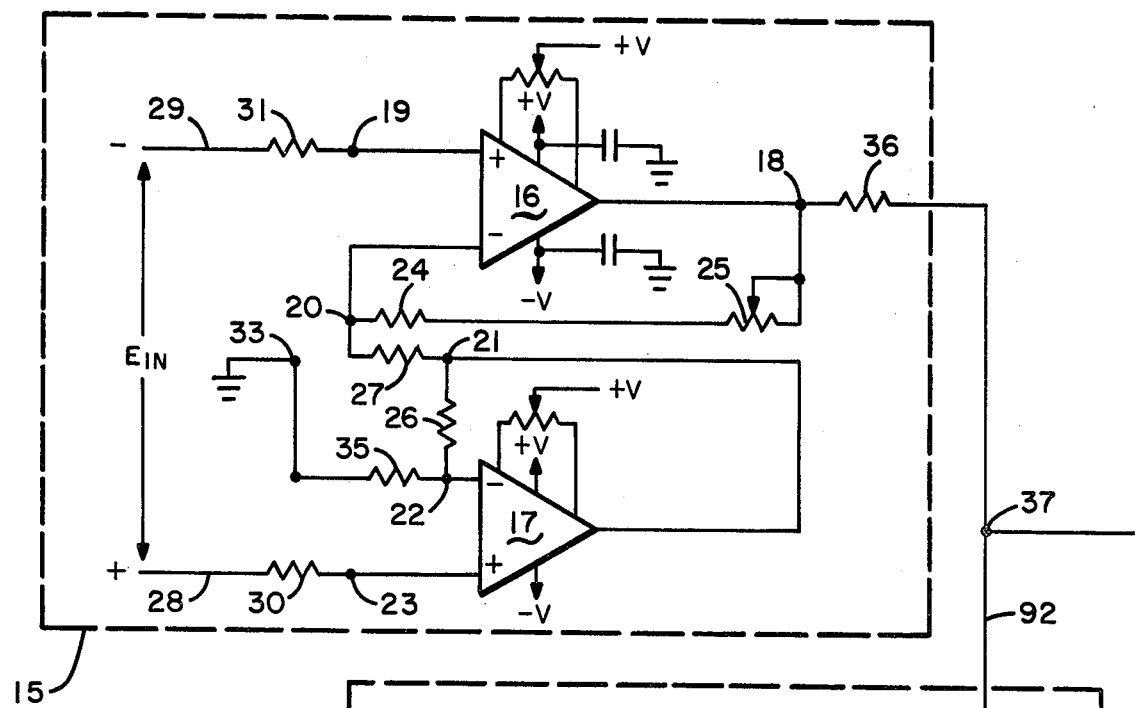
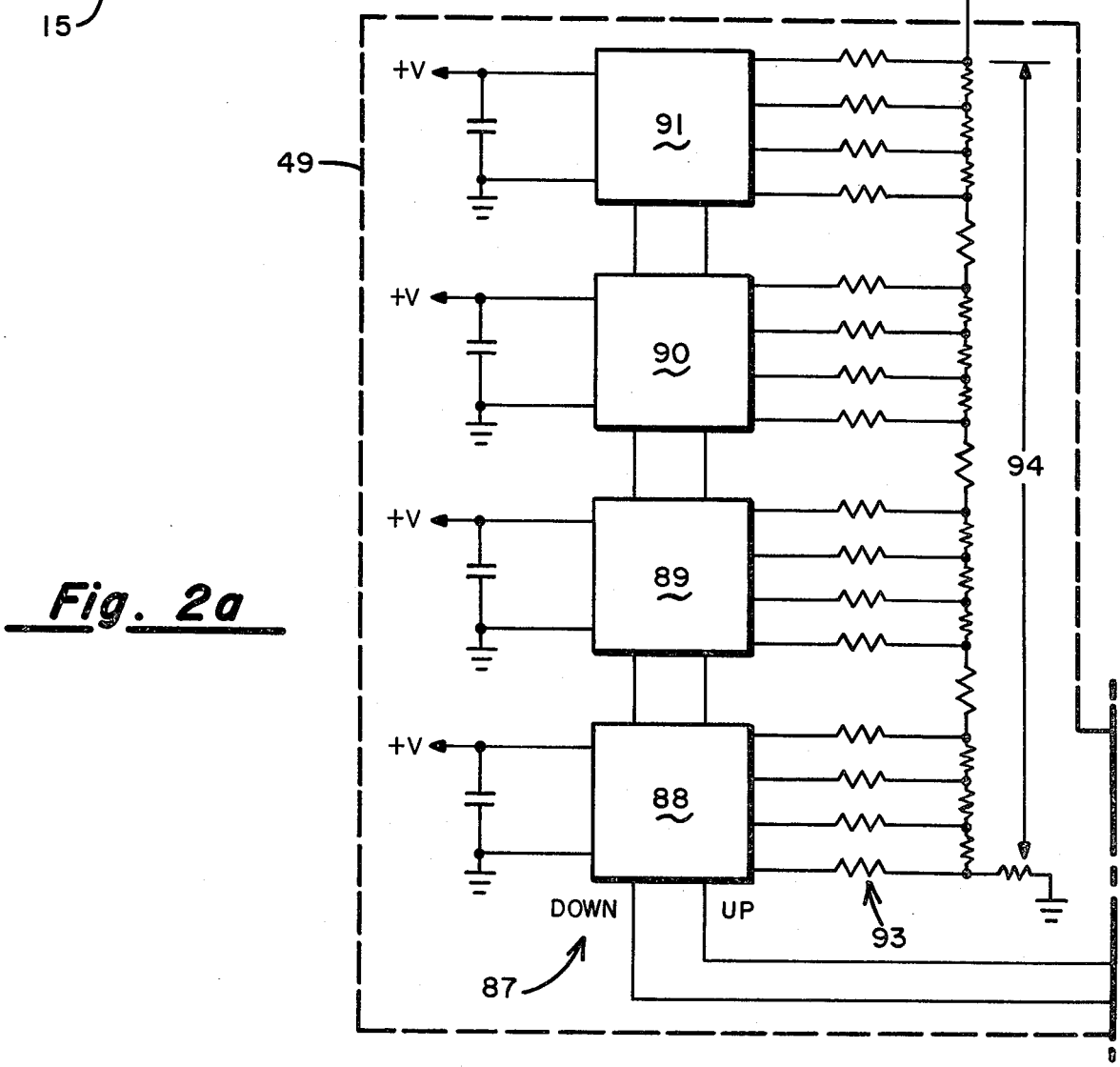
*Fig. 2a*

INSTRUMENT ZEROING CIRCUIT

BACKGROUND OF THE INVENTION

1. Field of the Invention

This invention relates generally to an electronic apparatus for facilitating the measurement and recording of time varying electrical signals, and more specifically to an electronic interface circuit which may be operated to null out any steady-state or DC bias on which the time varying signal may be superimposed to thereby allow a more accurate processing or reproduction of the time varying signal component.

II. Discussion of the Prior Art

In various electronic systems, it is desirable to measure, monitor or record electrical signals obtained from a signal generating means. For example, in the field of gas or liquid chromatography, the intelligent signal indicative of a change or variation in transmissivity of light through a medium is, in fact, a relatively minute change in a otherwise large DC bias level. Typically, the intelligence signal may be a few hundredths of a percent of the ordinary bias level. When an attempt is made to record such a low level time varying signal, a difficulty arises because the scale setting of the recording instrument must be maintained at too low a value to produce any meaningful amplification of the time varying component because the corresponding amplification of the DC bias level would tend to overdrive the recorder or other measuring instrument. Thus, a need exists for a suitable interface between a sensing apparatus and a downstream recorder or measuring device so that the DC bias level is effectively removed in a fashion which will not distort the time varying component. Once the DC bias is removed, the time varying signal may be amplified to a desired level compatible with the recording or monitoring equipment.

SUMMARY OF THE INVENTION

The present invention comprises an electronic interface arrangement for use between low level signal sensing apparatus and signal measuring/recording apparatus, the interface circuit having first and second negative feedback loops which function in sequence to cause a nulling or cancellation of the steady-state, DC bias level of an input signal where that input signal constitutes a minute variation from that DC bias level. The input stage of the present invention to which the input signal is applied comprises an instrumentation amplifier and functions in a conventional manner to provide a desired high input impedance to the sensor apparatus as well as a significant degree of common mode noise rejection. The output from the instrumentation amplifier is connected to a summing node which, in turn, is coupled to a first input of an operational amplifier configured as a summing amplifier. The output from the summing amplifier is arranged to be coupled to the recorder or other device with which the present invention is used. The summing amplifier performs a summation of the output from the instrumentation amplifier with the feedback signals yet to be described. In addition, the summing amplifier provides a low output impedance which is suitable for driving the recording equipment.

Associated with the summing amplifier are two feedback loops, one which may conveniently be referred to as the "digital zero loop" and the other as the "sample & hold loop". The digital zero loop includes means for sensing the output voltage from the summing amplifier, and when zeroing is desired, the digital loop provides a bias voltage which, when applied to the summing node, operates through the summing amplifier to drive the output voltage toward a zero volt steady-state value. More specifically, the digital zero loop includes a voltage controlled oscillator (VCO) whose output frequency is proportional to the deviation of the summing amplifier's output from zero. The VCO's output is fed through steering logic to one or the other of the up or down input terminals of a digital counter such that the counter will provide a digital word which is proportional to the deviation of the output of the summing amplifier from zero. This digital word is then applied to a digital-to-analog converter and it is the resulting analog signal which is applied to the summing node at the input of the summing amplifier.

The analog signal obtained from a digital-to-analog converter normally is subject to small variations due to granularity of the digital circuitry. This is commonly referred to as "zero-bit bobble".

The second feedback loop, i.e., the sample & hold loop, is inactive during the time interval that the digital zero loop is operational. Following completion of the digital zeroing, the sample & hold loop is rendered active and it provides an input to the summing node of the summing amplifier in a way that tends to eliminate the inherent deviation from the zero level setting occasioned by zero-bit bobble.

Thus, when activated, the circuit of the present invention effects nulling of the steady-state bias level which may be present in the input signal, thereby leaving the time varying component superimposed upon a zero volt bias level.

OBJECTS

It is accordingly a principal object of the present invention to provide an interface circuit which may be used to couple electronic sensing equipment to a recorder or waveform analyzer in such a fashion that only the time varying component of the input waveform results.

Another object of the invention is to provide an interface circuit which, upon operator command, causes any DC bias level in an input signal to be nulled.

Still another object of the invention is to provide an electronic interface circuit for coupling a sensing system to a recorder or other waveform analyzer, the interface circuit being activated by an operator to cause any steady-state signal level which may be present in an input waveform to be nulled out, to thereby leave only a time varying signal for further processing.

Yet still another object of the invention is to provide an interface circuit for use with sensing and recording equipment which utilizes two negative feedback loops, one operating in a digital mode, the other operating in a sample & hold mode, the net result being a synergistic cooperation wherein problems inherent in most digital feedback networks are obviated by the sample & hold loop while problems inherent in feedback systems employing only a sample & hold loop are obviated by the inclusion of the digital loop.

These and other objects and advantages of the invention will become apparent to those skilled in the art from the following detailed description of a preferred embodiment, when considered in conjunction with the accompanying drawings in which like numbers in the several views refer to corresponding parts.

DESCRIPTION OF THE DRAWINGS

FIG. 1 is a simplified block diagram of the system in which the interface circuit of the present invention finds use along with the illustrative waveforms; and FIGS. 2a through 2c, when organized as illustrated in FIG. 2, comprises a schematic electrical diagram of the preferred embodiment.

DESCRIPTION OF THE PREFERRED EMBODIMENT

Figure 2B:
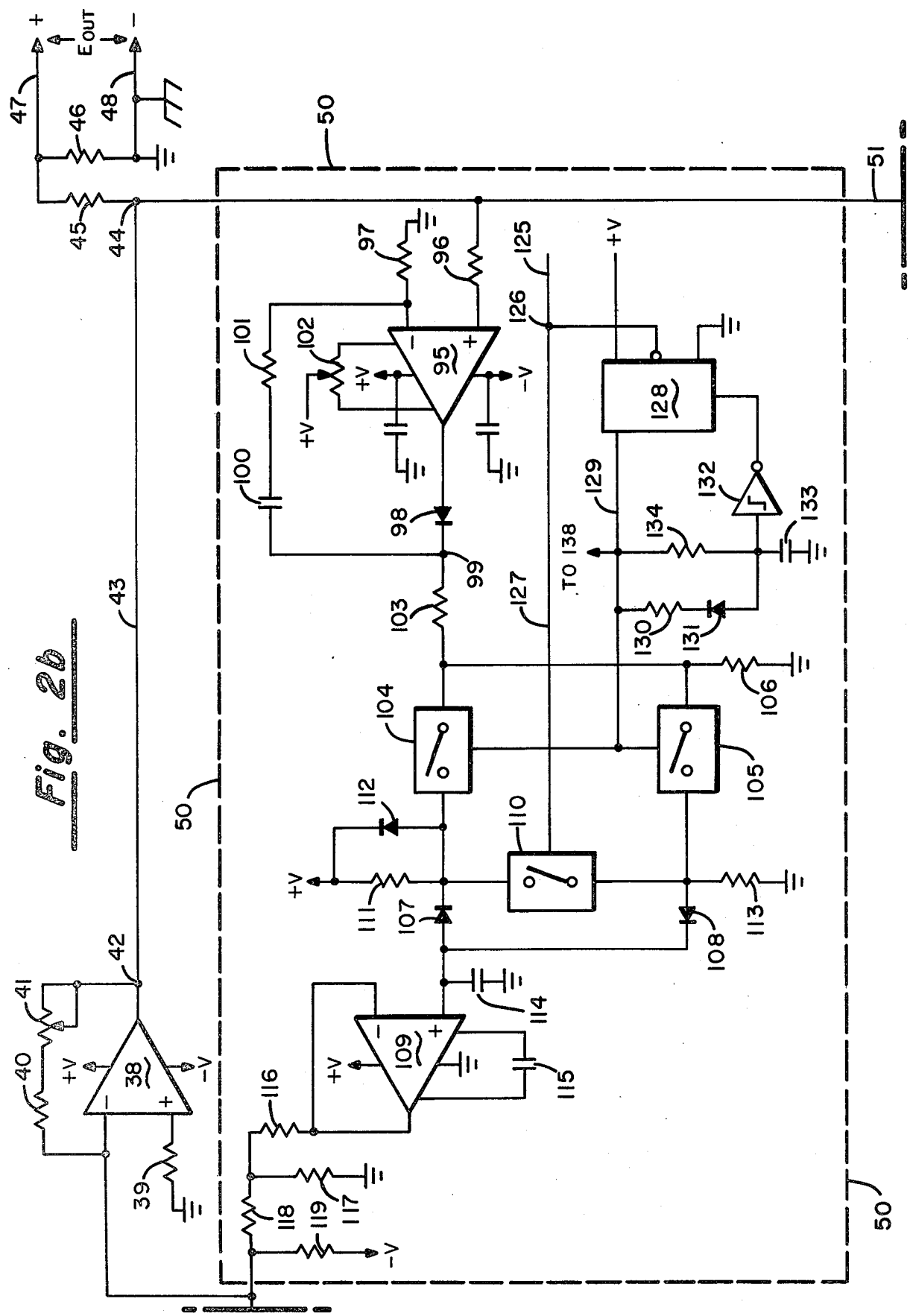

Referring first to FIG. 1, the interface apparatus of the present invention is indicated generally by numeral 10 and is electrically connected between an electronic sensing device 11 and a waveform measuring/recording device 12. If, for example, the electronic sensing apparatus comprises a high pressure liquid chromatograph for detecting the presence or absence of trace amounts of a given chemical constituent in a solution, the output signal therefrom typically comprises a relatively steady-state DC bias level (which may be subject to drift) on which is superimposed a time varying intelligence signal. The composite waveform is represented at 13 in FIG. 1. If, for example, the time varying signal has an amplitude of 100 microvolts, but is superimposed upon a DC steady-state bias of, say, $\frac{1}{2}$ volt, the time varying component of interest may be difficult to analyze due to a difficulty in amplifying the time varying component independent of the DC bias level. Thus, if the waveform recording/measuring apparatus has a scaling switch set to accommodate the DC bias level, the recorder would not be sufficiently sensitive to permit accurate recording of the time varying component. If, however, the DC bias level could be accurately nulled out to zero, thus leaving only the time varying component, that component may now easily be applied to suitable amplifying and waveform processing circuits whereby the time varying components can be measured and/or recorded. It is the function of the interface apparatus 10 to accomplish this nulling function without distorting or destroying the time varying component. In FIG. 1, the output from the interface apparatus 10 is represented by waveform 14 as excursions from the zero volt level.

Now that the overall function of the interface apparatus of the present invention has been set out with the aid of the general block diagram of FIG. 1, consideration will be given to the specifics of the implementation of that interface circuit 10. In this regard, reference will be made to the drawings comprising FIG. 2.

With reference to FIG. 2a, there is shown as being enclosed by the broken line box 15 an instrumentation amplifier which includes first and second operational amplifiers 16 and 17 which are designed to provide a high input impedance, good common mode noise rejection and an overall gain of two. The operational amplifiers 16 and 17 each have an output and positive (non-inverting) and negative (inverting) inputs with appropriate first and second negative feedback resistances connected respectively between the outputs and the inverting inputs. More specifically, the operational amplifier 16 has an output terminal 18, a positive input terminal 19 and a negative input terminal 20. Similarly, the operational amplifier 17 has an output terminal 21, a negative input terminal 22 and a positive input terminal 23. A negative feedback resistance in the form of a fixed resistor 24 and a variable resistor 25 is disposed in series between the output terminal 18 of the operational amplifier 16 and its negative input terminal 20. A fixed resistor 26 is connected between the output terminal 21 of the operational amplifier 17 and its inverting input terminal 22. A further fixed resistor 27 is coupled between the output terminal 21 of the operational amplifier 17 and the inverting input terminal 20 of the operational amplifier 16.

The input signal from the sensing circuitry 11 is applied across the input terminals 28 and 29. The signal applied to terminal 28 is coupled through a fixed resistor 30 to the positive input terminal 23 while a fixed resistor 31 interfaces the sensing apparatus to the positive input terminal 19 of the operational amplifier 16. Another resistor 35 is connected between a grounded junction 33 and the inverting input terminal 22 of the operational amplifier 17.

The output from the instrumentation amplifier including the operational amplifier stages 16 and 17 is coupled through a summing resistor 36 to the negative input terminal 37 of an operational amplifier 38 which is configured to function as a summing amplifier. The positive input terminal of the operational amplifier 38 is coupled through a resistor 39 to ground and a feedback loop including a fixed resistor 40 and a variable resistor 41 is coupled between the output terminal 42 of the summing amplifier 38 and its negative input terminal 37. As will be set forth in greater detail hereinbelow, the component values associated with the summing amplifier 38 are such that it produces unity gain. The gain may be adjusted, within limits, by means of the variable resistor 41.

The output from the summing amplifier is coupled by a conductor 43 to a junction point 44 and from there through a voltage divider including the resistors 45 and 46 to the output terminals 47 and 48. In that the instrumentation amplifier stages 16 and 17 were configured to provide an overall gain factor of two volts per volt and the summing amplifier has a gain of one, by making resistor 45 the same ohmic value of the resistor 46, the overall gain of the system, $E_O/E_{in}$ will be equal to 1.

As mentioned earlier, the summing amplifier 38 has associated with it first and second negative feedback control loops. For reasons which will become apparent, the first negative feedback control loop may conveniently referred to as the "digital loop" while the second negative feedback control loop may be referred to as the "sample & hold" feedback loop. The first or digital feedback control loop is shown as being enclosed by the broken line box 49 while the so-called sample & hold feedback loop is shown as enclosed by the broken line box 50.

Referring first to the digital feedback loop 49, it can be seen that the junction 44, which at all times carries a signal equal to the output from the summing amplifier 38, is coupled by a conductor 51 to a junction point 52. First and second difference amplifiers 53 and 54 are respectively coupled to the junction point 52 by way of resistors 55 and 56, resistor 55 being connected to the positive input terminal of the operational amplifier 53 and the resistor 56 being connected to the negative input terminal of the differential amplifier 54. The negative input terminal of the difference amplifier 53 is coupled through a fixed resistor 57 to ground and, in a similar fashion, the positive input terminal of the operational amplifier 54 is coupled through a corresponding resistor 58 to ground.

The output terminal of the difference amplifier 53 is connected through a semiconductor diode 59 to a junction point 60 on a conductor 61 while a semiconductor diode 62 connects to a further junction 63 on that same conductor 61. Feedback resistors 64 and 65 are coupled between the negative input terminals of the operational amplifiers 53 and 54 and the conductor 61. It can be seen, then, that the difference amplifiers 53 and 54 are configured to amplify the difference between the output from the summing amplifier 38 and the zero volt level represented by ground. When the output from the summing amplifier is negative, it is the amplifier 54 which is operative to produce the difference signal whereas when the output from the summing amplifier 38 is positive, it is the difference amplifier 53 which is operative to produce the difference signal.

The outputs from the respective difference amplifiers 53 and 54 which appear at the junction point 63 are coupled through a fixed resistor 66 and a semiconductor diode 67 to the input of a voltage controlled oscillator (VCO) which is indicated generally by numeral 68. The voltage controlled oscillator comprises a Schmidt trigger inverter circuit 69 which has a resistor 70 and a diode 71 coupled between its output junction 72 and its input junction 73. The cathode of the semiconductor diode 67 is also directly connected to the input junction 73, as is a bias resistor 74 which is coupled at its other end to a source of positive potential, e.g., ten volts.

The output from the VCO is coupled through a further Schmidt trigger inverter circuit 75 to the first input of a set of NAND gates including gates 76 and 77 which, together, function as a pulse steering circuit as will be further explained. The second input to the NAND gates 76 and 77 provides the enabling for determining which of these two gates will pass the oscillator output signal. Included in the enabling circuit is an operational amplifier 78 which has its positive input terminal coupled to ground by way of a resistor 79 and which has its negative input terminal coupled through a corresponding resistor 80 to the bus 51 which, in turn, receives the output from the summing amplifier 38 via conductor 43 and the junction 44. Associated with the operational amplifier 78 is a capacitive feedback element 81 which is connected between the negative input terminal of the operational amplifier and its output terminal 82. A variable resistor 83 is included and permits the adjustment of the zero level of the operational amplifier 78 which, in turn, determines the zeroing of the entire digital loop enclosed by the broken line box 49.

The output which is developed at the junction 82 is coupled via a resistor 84 and a Schmidt trigger inverter 85 to the enable input of the NAND gate 77. The output from inverter 85 is coupled through a similar inverter 86 to the enable input of the NAND gate 76. Therefore, depending upon the polarity of the output from the operational amplifier 78, either NAND gate 77 or NAND gate 76 will be enabled to pass the output from the VCO circuit 68. The polarity of the output from the operational amplifier 78 is, of course, determined by the relative polarity of the output signal from the summing amplifier 38 with respect to ground.

The output from the NAND gate 76 is connected to the "count-down" terminal of a digital up/down counter indicated generally by numeral 87. The counter 87 is shown as including four modules respectively numbered 88 through 91 for identification purposes. In a similar fashion, the output from NAND gate 77 connects to the "count-up" input terminal of the counter 87.

Each of the counter modules 88 through 91 may comprise four separate bistable stages and, hence, when the chips 88 through 91 are connected in tandem with the "carry" and "borrow" outputs of one module connected to the "count-up" and "count-down" inputs of the next higher order module, the composite counter is capable of storing $2^{16}$ different binary values.

The individual outputs from the counter stages are coupled through a resistor ladder network to the summing node 37 by way of a conductor 92. As is indicated in the drawings, each of the output lines from the counter stages 88 through 91 has a resistor 93 in series and further resistors as at 94 are connected in series with one another between the summing node 37 and ground. Each of the resistors 93 has one terminal thereof connected intermediate two series coupled resistors 94. As such, depending upon which of the stages of the counter 87 are set or cleared, each will contribute to the overall feedback signal applied to the summing node 37. The amount of the contribution is, of course, determined by the digital number contained within the up/down counter module 87 which, in turn, is determined by the output from the VCO.

The sample & hold feedback loop surrounded by the broken line box 50 includes a difference amplifier 95 having its positive input terminal coupled through a resistor 96 to the bus 51 and having its negative input terminal coupled through a corresponding resistor 97 to ground. The output from the amplifier 95 is coupled through a semiconductor diode 98 to a junction 99 and feedback elements including the series combination of a capacitor 100 and a resistor 101 are coupled between that junction 99 back to the negative input terminal of the amplifier 95. A variable resistor 102 is coupled in circuit with the operational amplifier 95 and provides a means for adjusting the zeroing of the sample & hold loop.

The junction 99 is coupled through a resistor 103 to terminals of semiconductor-type bilateral switch elements 104 and 105 and through a resistor 106 to ground. The other terminals of the switch elements 104 and 105 are coupled through low leakage semiconductor diodes 107 and 108 to the positive input of an operational amplifier 109 which functions as a holding amplifier in the circuit of the present invention. Connected across the output terminals of the switch elements 104 and 105 is a further semiconductor bilateral switch element 110. A parallel combination of a resistor 111 and a semiconductor diode 112 is connected between a source of positive potential +V and the terminals of the switch elements 104 and 110. A resistor 113 is connected between the common junction of the switch elements 105 and 110 and ground.

The holding amplifier 109 has its output connected directly to the negative input terminal thereof and a low leakage holding capacitor 114 is connected between the positive input terminal of the amplifier 109 and ground. A further capacitor 115 is connected in circuit with the holding amplifier and functions to stabilize 109. The output from the holding amplifier is coupled through a resistive voltage divider including the resistors 116 and 117 and a resistor 118 to the coductor 92 which, as mentioned, connects to the summing node 37 of the summing amplifier 38. A bias resistor 119 is coupled between that node 37 and a source of negative reference potential −V.

Control over the zeroing operation and the timing of the network thus far described will now be set forth. A manually operable push button switch 120 having one terminal grounded has its other terminal connected to a R-C timing circuit including a resistor 121 and a capacitor 122, these two components being serially connected between a source of positive reference potential $+V$ and ground. The common junction between the resistor 121 and the capacitor 122 which is common to a terminal of switch 120 is also coupled to the input of a Schmidt trigger type inverter 123 whose output terminal 124 is coupled by a conductor 125 to a junction point 126 which connects to the control input line 127 of the semiconductor bilateral switch element 110. The junction 126 is also coupled to the clock input of a JK-type flip-flop 128. This device is arranged to be negative edge triggered and has its J input terminal connected directly to the source $+V$. The K input terminal thereof is connected directly to ground. The Q output from the flip-flop 128 connects via conductor 129 to the control inputs of the bilateral switch elements 104 and 105. These switch elements are arranged such that when the signal applied to the control terminal is a binary "high", a relatively low impedance exists between the switch terminals thereof. However, when the signal applied to the control terminal is a binary "low", the relative impedance between the terminals of the switch element are high, indicative of an open switch condition. The output terminal Q of the flip-flop 128 is also coupled through a resistor 130, a semiconductor diode 131 and a Schmidt trigger type inverter 132 to the reset input of the flip-flop 128. A timing capacitor 133 is connected between the input of the inverter 132 and ground. Similarly, a resistor 134 is connected between the Q output of the flip-flop 128 and the input to the inverter 132.

Completing the circuit is a shut-off control for the VCO 68. This includes the diode 135 coupled between the junction 73 and the junction 124 and the capacitor 136 which is coupled between the junction 73 and ground. Furthermore, it may be desirable to provide an indicator whereby the status of the circuit may be determined. In this regard, first and second diodes 137 and 138 are connected as an OR circuit at junction 139, the anode of the diode 137 being connected to the junction 124 and the anode of the diode 138 being connected to the Q output of the JK flip-flop 128. The junction 139 is coupled through a resistor 140 and a VMOS FET device 141 whose drain electrode is coupled through a resistor 142 and a LED indicator diode 143 to a source of positive potential. The source terminal of the VMOS FET device 141 is connected by a conductor 144 to power ground.

Now that the details of the construction of the interface circuit of the present invention have been set out in detail, consideration will be given to the mode of operation.

OPERATION

Let it be assumed that the input signal to the interface apparatus of the present invention comprises a steady-state or DC bias level of a predetermined voltage on which is superimposed an intelligence signal in the form of a variation either above or below that DC bias value. This signal is applied to the input terminal 28 and 29 of the instrumentation amplifier stage 15 in FIG. 2a. The instrumentation amplifier stage is operative to provide an extremely high input impedance so as not to load the intelligence signal source apparatus providing the input signal. It also affords a very high common mode rejection ratio. Some control over the common mode rejection ratio can be achieved by adjusting the variable resistor 27. Furthermore, the overall gain of the instrumentation amplifier 15 is determined by the component values of the resistors 35, 26, 27, 24, and 25 and, in the preferred embodiment, these values are arranged to provide an overall gain of two volts per volt. Typically, the input impedance for the instrumentation amplifier may be 30 megohms and the common mode rejection ratio may be around 120 dB. The output signal appearing at the junction 18 then is coupled through a summing resistor 36 to the summing node 37 of the operational amplifier 38. As has already been mentioned, the operational amplifier 38 is configured to operate as a summing amplifier wherein the input current applied to the inverting input of the operational amplifier 38 comprises the algebraic sum of a number of inputs, including those coming from the instrumentation amplifier stage 15, the digital feedback loop 49 and the sample & hold feedback loop 50. The gain of the summing amplifier is established by the feedback resistors 40 and 41 and, in that the resistor 41 is adjustable, some degree of control over the stage gain can be achieved. In carrying out the present invention, the feedback resistors 40 and 41 are adjusted to give a unity gain.

The manner in which the input current components produced by these feedback loops are generated will be discussed in greater detail hereinbelow. Suffice if for now to say that the signal appearing at the output junction 42 of the summing amplifier comprises an amplified version of the input signal as corrected by whatever negative feedback signals may be produced by the feedback loops 49 and 50. For the moment, let it be considered that the zeroing switch 120 has not been operated and that the holding capacitor 114 is not storing a charge. As a result, there will be no current contribution at the summing node 37 produced by these two feedback loops and the output signal at the junction 42 will comprise an amplified version of the signal applied to the input terminals 28 and 29 of the instrumentation amplifier. Thus, under the assumed conditions, the intelligence signal will still be riding upon the steady-state DC bias level.

Next assume that it is desired to null out or zero out the DC or steady-state component so that only the intelligence signal will remain. That is to say, the intelligence signal will be superimposed upon a zero volt DC bias level. To achieve this result, the operator momentarily closes the auto zero switch 120. Prior to this time, the timing capacitor 122 had been charged up to a predetermined voltage due to the current flowing from the $+V$ source through the resistor 121. This signal had appeared as a binary "high" to the Schmidt trigger inverter 123 such that the signal appearing at junction 124 had been low. This low signal ensures that the VCO 68 is shut off and, thus, not feeding pulses to the binary counter 87.

When the switch 120 is momentarily closed, the capacitor 122 immediately discharges through that closed switch to ground causing the input to the inverter 123 to become low. This low signal, when inverted, becomes a high signal at the junction 124. Immediately upon release of the push button switch 120, the capacitor 122 will again begin to charge through the resistor 121 from the voltage source $+V$ and after a time interval determined by the component values of the resistor 121 and the capacitor 122, the output from the inverter 123 will again shift to its low condition. While the output from the inverter 123 is high, that signal will be applied by way of conductor 126 to the control terminal 127 of the bilateral switch element 110 causing that switch to exhibit a low impedance corresponding to a closed switch condition. This effectively forward biases the low leakage diode 107 causing the charge on the holding capacitor 114 to be dissipated.

Also, when the output from the inverter 123 is high, the VCO circuit 68 is rendered operational to produce pulses at its output terminal 72 which are proportional in their frequency to the voltage input to the VCO appearing at junction 73. That voltage is, of course, proportional to the difference between the output signal from the summing amplifier appearing at the junction 42 and the zero volt (ground) level applied to the differential amplifiers 53 and 54. Assuming that the DC bias level is positive in polarity, it will be the operational amplifier 53 which functions to produce an output signal proportional in amplitude to the difference between the DC bias level and ground. However, when the DC bias is negative in polarity, the differential amplifier 54 is the circuit which produces the output signal proportional to the difference between the DC bias and ground reference. Irrespective of which of the two differential amplifiers is producing an output, they are OR'ed together at the junction 63 and coupled through the resistor 66 and the diode 67 to the input of the VCO. Hence, the output from the VCO will be proportional in frequency to the applied input signal amplitude.

The output from the VCO is fed through a logic arrangement which performs a pulse steering function. Specifically, the steering circuit including the NAND gates 76 and 77 will route the VCO output to either the count-up or count-down terminals of the digital counter 87. The steering circuit, itself, is controlled by the output from the difference amplifier 78. This amplifier is configured to receive the output from the summing amplifier 38 (via conductors 43 and 51) and to produce an output proportional in amplitude to the difference between that signal and ground. Depending upon whether that signal is positive or negative, either the gate 76 or 77 will be enabled. For example, if the output from difference amplifier 78 is positive the resulting signal passing through inverters 85 and 86 will enable NAND gate 76 such that the output from the VCO will be applied to the count-down terminal of the counter 87. On the other hand, when the output from the difference amplifier 78 is negative, the NAND gate 77 will be partially enabled by the high signal emanating from the Schmidt trigger inverter circuit 85, causing the clock pulses from the VCO to propagate through the gate 77 to the count-up terminal of the counter 87.

The contents of the counter affect the current output from the resistive ladder network which, in turn, is coupled to the summing node 37 of the summing amplifier 38. Depending upon the count value entered into the binary counter 87, a contribution will be made to the feedback signal tending to null out the DC bias level.

Where only a digital feedback loop is incorporated, there is an inherent error in the amplitude of the signal fed back to the summing node due to the granularity of the counting process. This is commonly referred to as the "zero-bit bobble" of the counter. That is to say, when the lowest order stage of the counter switches back and forth, it introduces a current increment which causes the feedback signal to deviate in a minor fashion from the true zero DC bias level. As will now be explained, it is the function of the sample & hold loop to eliminate the effects of the zero-bit bobble phenomena.

Following the time period established by the resistor 121 and the capacitor 122 following the closing and release of the switch 120, the Schmidt trigger inverter 123 will undergo a transition from a binary high to a binary low level. When this signal goes low, the voltage at junction 73 is clamped to that low level and the VCO 68 ceases to oscillate. Also, the negative going edge occasioned by the transition of the output from the inverter 123 from its high to its low state is applied by way of conductor 125 to the clock input terminal of the JK flip-flop 128. This negative transition serves to clock the flip-flop, causing its Q output to go high. That signal remains high for a period determined by the time constant of the resistor 134 and the capacitor 133. Following a predetermined time delay established by those components, the inverter 132 will output a signal to again reset the JK flip-flop at the conclusion of the zeroing operation.

For the moment, however, it is assumed that the signal on conductor 129 is high. This signal, when applied to the control terminals of the semiconductor bilateral switches 104 and 105 cause them to assume a closed (low impedance) condition. At this time, the signal on the control electrode 127 of the bilateral switch element 110 is low such that switch element 110 can be considered to be open. When the switches 104 and 105 are closed and the switch 110 is open, the output from the differential amplifier 95 is able to pass either through closed switch 104 or closed switch 105 and one of the oppositely poled low leakage diodes 107 or 108 so as to charge the holding capacitor 114. The differential amplifier 95 has its non-inverting input connected to sample the output from the summing amplifier appearing at junction 42. Again, depending upon the polarity of this signal, the operational amplifier 95 will produce either a positive or a negative output causing the voltage on the holding capacitor 114 to change accordingly. The purpose of the diode 98 is to remove negative spikes from the output in that such spikes could damage the semiconductor switching elements 104 and 105. The resistor 101 and the capacitor 100, when connected as illustrated in FIG. 2b, provide requisite damping and add stability to the sample & hold loop.

Thus, during the interval defined by the time between the setting and resetting of the JK flip-flop 128, the output from the operational amplifier 95 will be sampled and held in the holding capacitor 114. This signal is, as mentioned, proportional to the difference between the output from the summing amplifier 42 and ground or zero volt level. The signal held on the capacitor 114 is buffered by the holding amplifier 109 and appears at its output. Any variations in the input signal to the operational amplifier 95 during the sampling interval will be tracked. Thus, the sample & hold feedback loop can be considered as a vernier control on the digital feedback loop 49 to obviate the variations caused by zero-bit bobble.

The output from the holding amplifier 109 is coupled through the voltage divider including resistors 116 and 117 and through the resistor 118 to the summing node 37. Thus, the sample & hold feedback loop contributes to the signal tending to null out the DC bias level which may be present in the output from the instrumentation amplifiers 16 and 17.

It is to be noted that a further resistive voltage divider including resistors 45 and 46 is connected to the output junction 44. The component values of the resistors used in this voltage divider are such as to reduce the gain by one-half. In that the overall gain of the circuit, including the instrumentation amplifiers (gain equal to two) and the summing amplifier (gain equal to one), is a net gain of two, the voltage divider coupled to the junction 44 will cause the overall gain of the system to be reduced to unity.

Figure 2C:
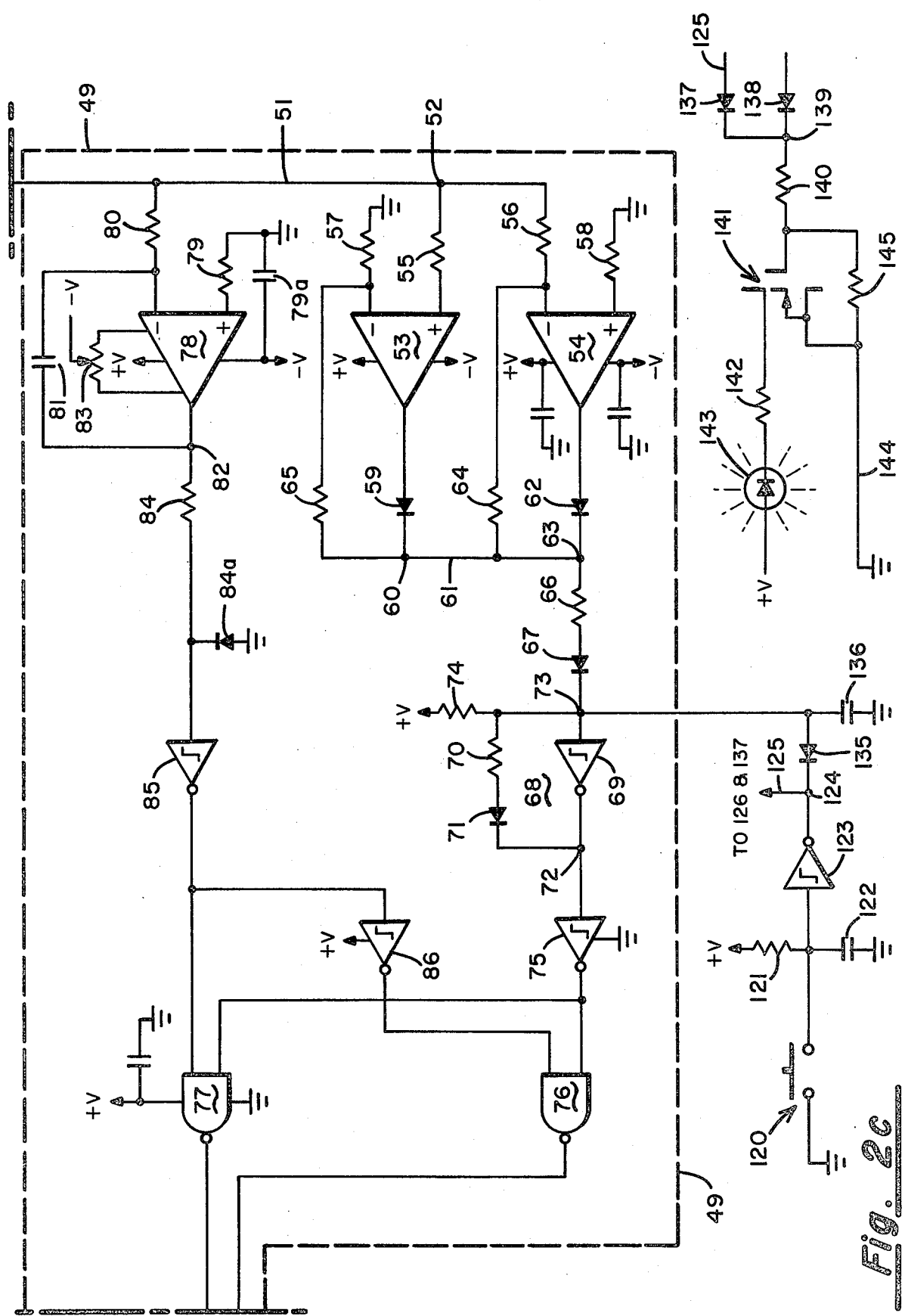

It can be seen, then, that the interface circuit comprising FIG. 2 of the drawings does not affect the overall gain of the system in which it is used. Its sole function is to null out or remove any DC steady-state bias level from the input signal such that the intelligence signal superimposed thereon will be reference to ground. Accordingly, any further signal processing, including amplification, recording, measurement, etc., will be with reference to the intelligence signal only.

In that the circuit operates to null out differences in DC bias level from a zero voltage level, during operation, a point is reached when the output signal at the junction 42 is effectively zero volts. It is the function of the resistor 74 coupled to the voltage source +V to keep the oscillator 68 running at a very low frequency when the outputs from the differential amplifiers 53 and 54 are no longer contributing significantly to any changes in frequency of the VCO.

It is the variable resistor 83 associated with the difference amplifier 78 which determines the zeroing of the entire digital loop. That is to say, by properly adjusting the resistor 83, the point at which oscillator output pulses are applied to either the count-up or the count-down terminal of the counter via the steering network is established.

It is the function of the low leakage diode 107, the resistor 111 and the diode 112 to protect the operational amplifier 109 from being damaged when power to the system is turned off. Upon power turn-off, the capacitor 114 is able to discharge through the diode 107 and the diode 112.

When the interface circuit of the present invention is operational to provide nulling or zeroing of the DC bias level, it may be desirable to provide a visual indication that the zeroing operation is in progress. In this regard, the signal from the output of the Schmidt trigger inverter 123 is connected to the anode of a semiconductor diode 137 and at the same time the state of the JK flip-flop 128 output is connected to the anode of the diode 138. The cathode electrodes of these two diodes are OR'ed together at the junction 139 and fed through a VMOS FET 141 whereby the LED 143 is illuminated. When the signals applied to the diodes 137 and 138 are both low, the VMOS FET will be in a high impedance condition and insufficient current can flow through the LED to cause it to glow. Thus, only when either the digital feedback loop 49 or the sample & hold feedback loop 50 is functioning during the zeroing interval will the LED 143 be glowing.

With no limitation intended, the following table sets forth typical components values which may be used in implementing the preferred embodiment.

COMPONENT VALUES

Resistors

| Item No. | Value (ohms) |
| --- | --- |
| 24 | 9.53 K |
| 25 | 1 K var. |
| 26, 27, 30, 31, 35 | 10 K |
| 70, 84, 113, 116, 130 | 30 K |
| 36 | 40 K |
| 79, 80 | 10 K |
| 39 | 20 K |
| 40 | 39.2 K |
| 41, 101, 106, 142 | 2 K |
| 45, 46 | 1 K |
| 55, 56, 57, 58, 145 | 51 K |
| 64, 65 | 5.1 M |
| 66 | 75 K |
| 74 | 7.5 M |
| 83 | 10 K var. |
| 93 | 200 K each |
| 94 | 100 K |
| 96, 97 | 51.1 K |
| 102 | 20 K var. |
| 103 | 100 |
| 111 | 46.4 |
| 117 | 200 |
| 118 | 200 K |
| 119 | 402 K |
| 121 | 150 K |
| 134 | 449 K |
| 140 | 27 K |

Capacitors

| | |
| --- | --- |
| 79a | 10 uf |
| 81 | 82 pf |
| 114 | 4 uf |
| 115, 136 | 220 pf |
| 122 | 10 uf |
| 133 | 0.2 uf |

Active Elements

| Item No. | Description |
| --- | --- |
| 16, 17, 38, 95 | Type 714 op. amp. |
| 53, 54 | Type LM207 op. amp. |
| 78 | Type 3140B op. amp. |
| 109 | Type 3130 op. amp. |
| 76, 77 | Type 74C00 NAND gate |
| 88, 89, 90, 91 | Type 74C193 |
| 128 | Type 74C107 JK flip-flop |
| 104, 105, 110 | Type 4066 Quad Bilateral Sw. |
| 107, 108 | Type FJT 1100 |
| 59, 62, 67, 71, 84a, 98, 131, 137, 138 | Type 1N4148 diode |
| 141 | Type VN10KM |

The invention has been described herein in considerable detail, in order to comply with the Patent Statutes and to provide those skilled in the art with information needed to apply the novel principles and to construct and use such specialized components as are required. However, it is to be understood that the invention can be carried out by specifically different equipment and devices, and that various modifications, both as to equipment details and operating procedures can be effected without departing from the scope of the invention itself.

What is claimed is:

1. Electronic apparatus for removing a direct current bias level from a composite input signal of the type having a time varying component superimposed on said direct current bias level, comprising:

(a) input means for receiving said composite input signal;

(b) summing amplifier means having an input terminal and an output terminal, said input terminal being coupled to said input means and first and second negative feedback loops adapted to be selectively coupled from said output terminal of said summing amplifier means to said input terminal thereof;

(c) said first feedback loop including means for generating a digital number proportional to the deviation of said output signal of said summing amplifier means from a zero voltage reference value, means for converting said digital number to an analog voltage, and means coupling said analog voltage to said input terminal of said summing amplifier;

(d) said second negative feedback loop including means for sampling the output from said summing amplifier means and for holding a voltage value proportional to the deviation of said output signal from said summing amplifier from a predetermined reference for a predetermined time and applying said voltage value to said input terminal of said summing amplifier; and (e) control means for effectively connecting said first feedback loop in circuit with said summing amplifier for a first predetermined time and for subsequently disconnecting said first feedback loop while coupling said second feedback loop in circuit with said summing amplifier for a second predetermined time.

2. The apparatus as in claim 1 wherein said means for generating a digital number proportional to the deviation of said output signal of said summing amplifier means from a zero voltage reference value comprises:

(a) first and second differential amplifiers coupled to receive the output from said summing amplifier, said first differential amplifier producing a voltage signal of an amplitude proportional to the deviation of said output from said summing amplifier from a zero reference value and of a first polarity when said direct current bias level is of a corresponding polarity with respect to said zero voltage reference and said second differential amplifier producing a voltage signal of an amplitude proportional to the deviation of said direct current bias level from said zero volt reference level and of a polarity opposite to said first polarity when said direct current bias level is also of said opposite polarity with respect to said zero volt reference level;

(b) a voltage controlled oscillator;

(c) means coupling said voltage signal of said first or said opposite polarity to said voltage controlled oscillator;

(d) digital counting means;

(e) polarity sensitive pulse steering means coupling said voltage controlled oscillator to said digital counting means for incrementing or decrementing the digital value stored in said digital counting means; and (f) a digital-to-analog converter circuit coupling the output of said digital counting means to said input terminal of said summing amplifier.

3. Apparatus as in claim 1 wherein said means for sampling the output from said summing amplifier means and for holding a voltage value proportional to the deviation of said output signal from said summing amplifier from a predetermined reference for a predetermined time comprises:

(a) difference amplifier means having one input thereof coupled to the output terminal of said summing amplifier means and another input thereof coupled to said predetermined reference;

(b) charge storage means;

(c) semiconductor switching means having input terminal means, output terminal means and control terminal means, said input terminal means being coupled to the output of said difference amplifier means and said output terminal means being coupled to said charge storage means;

(d) means coupling said charge storage means to said input terminal of said summing amplifier means; and (e) actuatable timing means coupled to said control terminal means of said semiconductor switching means.

4. Apparatus as in claim 2 wherein said polarity sensitive pulse steering means comprises:

(a) circuit means for sensing the relative polarity of the output of said summing amplifier means with respect to said zero volt reference;

(b) first and second NAND gates, each having a pair of input terminals and an output terminal;

(c) means coupling the output of said voltage controlled oscillator to one of said pair of input terminals on said first and second NAND gate;

(d) means coupling the output of said circuit means to the other input of said first NAND gate and the complement of said output of said circuit means to the other input of said second NAND gate; and (e) means coupling the output terminals of said first and second NAND gates to said digital counting means.

* * * * *